United States Patent
Gallagher

(10) Patent No.: US 7,394,710 B1
(45) Date of Patent: Jul. 1, 2008

(54) AUTO-RECOVERY FAULT TOLERANT MEMORY SYNCHRONIZATION

(75) Inventor: Timothy C. Gallagher, Littleton, CO (US)

(73) Assignee: Lockheed Martin Corporation, Bethesda, MD (US)

( * ) Notice: Subject to any disclaimer, the term of this patent is extended or adjusted under 35 U.S.C. 154(b) by 95 days.

(21) Appl. No.: 11/604,719

(22) Filed: Nov. 28, 2006

Related U.S. Application Data

(60) Provisional application No. 60/849,473, filed on Oct. 5, 2006.

(51) Int. Cl.
*G11C 7/00* (2006.01)
*G11C 8/00* (2006.01)

(52) U.S. Cl. ................ 365/221; 365/236; 365/239

(58) Field of Classification Search ............ 365/221
See application file for complete search history.

(56) References Cited

U.S. PATENT DOCUMENTS

| | | | |
|---|---|---|---|
| 5,079,693 A * | 1/1992 | Miller | 711/156 |
| 6,934,198 B1 * | 8/2005 | Lowe et al. | 365/189.05 |
| 2003/0172241 A1 * | 9/2003 | Shirota | 711/167 |
| 2003/0206475 A1 * | 11/2003 | Duh et al. | 365/221 |

* cited by examiner

*Primary Examiner*—Son L Mai
(74) *Attorney, Agent, or Firm*—McDermott Will & Emery LLP

(57) ABSTRACT

Automatic fault recovery of upsets in a memory controller are provided to minimize data loss. In addition to memory control, the present invention allows for the incorporation of majority voting circuits with integrated alignment between three voted data streams. The memory array is divided into two basic components: (1) the write side (data in); and (2) the read side (data out). Each of these components has a separate memory address counter. The write counter is loaded into a holding register during a synchronization period. After determining the validity of the write cycle for fault tolerance and setting data latency for pipelining, the read counter is loaded with the write counter value. The reading of the memory array commences at the counter value that was stored in the read counter, which is the same as the original write counter value.

16 Claims, 4 Drawing Sheets

AUTO-RECOVERY FAULT TOLERANT MEMORY SYNCHRONIZATION

RELATED APPLICATIONS

The present application claims priority to U.S. Provisional Patent Application No. 60/849,473 filed Oct. 5, 2006, the disclosure of which is incorporated herein by reference in its entirety.

STATEMENT REGARDING FEDERALLY SPONSORED RESEARCH OR DEVELOPMENT

Not Applicable.

BACKGROUND

1. Field

The present invention generally relates to memory controller synchronization and, in particular, relates to auto-recovery, fault tolerant synchronization of memory controllers.

2. Background

For space-based or high-reliability systems using memory controllers internal to Field Programmable Gate Arrays ("FPGAs"), radiation effects are a major concern. In applications with streaming data or other data flow, upsets in the internal memory structures can have both short- and long-term consequences to the validity of the information stored therein.

Other approaches to addressing this problem have compared write and read counters and stopped or interrupted the process on any overflow (i.e., when the write counter exceeds the read counter) or underflow (i.e., when the read counter exceeds the write counter). These approaches also use conditional flag generation (e.g., flags such as FULL, EMPTY, etc.) to start or stop the data flow.

These approaches present a number of problems because of their asynchronous signaling properties, which can generate glitches instead of valid signals when checking for FULL, EMPTY, or other conditions. Moreover, in case of faults, these approaches are not self-synchronizing and require additional circuitry or processing to recover from fault conditions.

SUMMARY

The present invention solves the foregoing problems by providing automatic fault recovery of memory upsets to minimize any data loss and by providing re-synchronization of the input/output data streams to prevent long term information corruption. In addition to memory control, the present invention provides for the incorporation of majority voting circuits with integrated alignment between three voted data streams.

The memory array of the memory controller is divided into two basic components: (1) the write side (data in); and (2) the read side (data out). Each of these components has a separate memory address counter. After determining the validity of the write cycle for fault tolerance, the read counter is loaded with the write counter value. The reading of the memory array commences at the value stored in the read counter, which is the same as the original write counter value.

Exemplary embodiments of the present invention relate to an integrated circuit memory control device, with a memory array having a read access port and a write access port. The integrated circuit memory control device has a write counter register that is coupled to an external data input and to the write access port of the memory array. The write counter register is configured to receive data from the external data input, generate a write address value, and store the received data in the memory array at the write address value. A read counter register configured to receive the write address value, where the read counter register reads the stored data from the memory array at the write address value.

Various exemplary embodiments of the present invention relate to methods of operating an integrated circuit memory control device that can support read and write access for at least one external input to a memory array. An external clock synchronization signal is received, and new data received from the at least one external input is written to the memory array at an address value stored by a write counter register. Next, the address value of the write counter register is stored in a hold register. The method also synchronizes an external clock synchronization signal with an internal clock synchronization signal to minimize metastability problems. A load signal is generated with a synchronization device upon receipt of an internal clock synchronization signal by the synchronization device. Next, a read counter register is loaded with the address value stored in the hold register. A read signal is generated with the synchronization device and reading data is read from the memory array at the address value that was loaded into the read counter register.

Exemplary embodiments of the present invention relate to an integrated circuit memory control device, having a memory array with a read access port and a write access port. A write counter register is coupled to an external data input. The write counter register is also coupled to the write access port of the memory array, where the write counter register is configured to receive data from the external data input, generate a write address value, and store the received data in the memory array at the write address value. A first register is coupled to a synchronization device, where the first register is configured to synchronize an external clock synchronization signal with an internal clock synchronization signal. A hold register is coupled to the write counter register, where the hold register is configured for storing the write address value of the write counter. A second register coupled to the hold register, where the second register is configured to receive the write address value and synchronize an external clock synchronization signal with an internal clock synchronization signal. A read counter register is configured to receive the write address value from the hold register. In addition, a synchronization device coupled to the read counter register and configured to receive an internal clock synchronization signal, where the synchronization device, upon receipt of the internal clock synchronization signal, instructs the read counter register to load the write address value and read stored data from the memory array at the write address value.

It is understood that other embodiments of the present invention will become readily apparent to those skilled in the art from the following detailed description, wherein it is shown and described only various embodiments of the invention by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

DETAILED DESCRIPTION

The detailed description set forth below in connection with the appended drawings is intended as a description of various embodiments of the invention and is not intended to represent the only embodiments in which the invention may be practiced. The detailed description includes specific details for the purpose of providing a thorough understanding of the invention. However, it will be apparent to those skilled in the art that the invention may be practiced without these specific details. In some instances, well known structures and components may be shown in block diagram form in order to avoid obscuring the concepts of the invention.

Figure 1A:
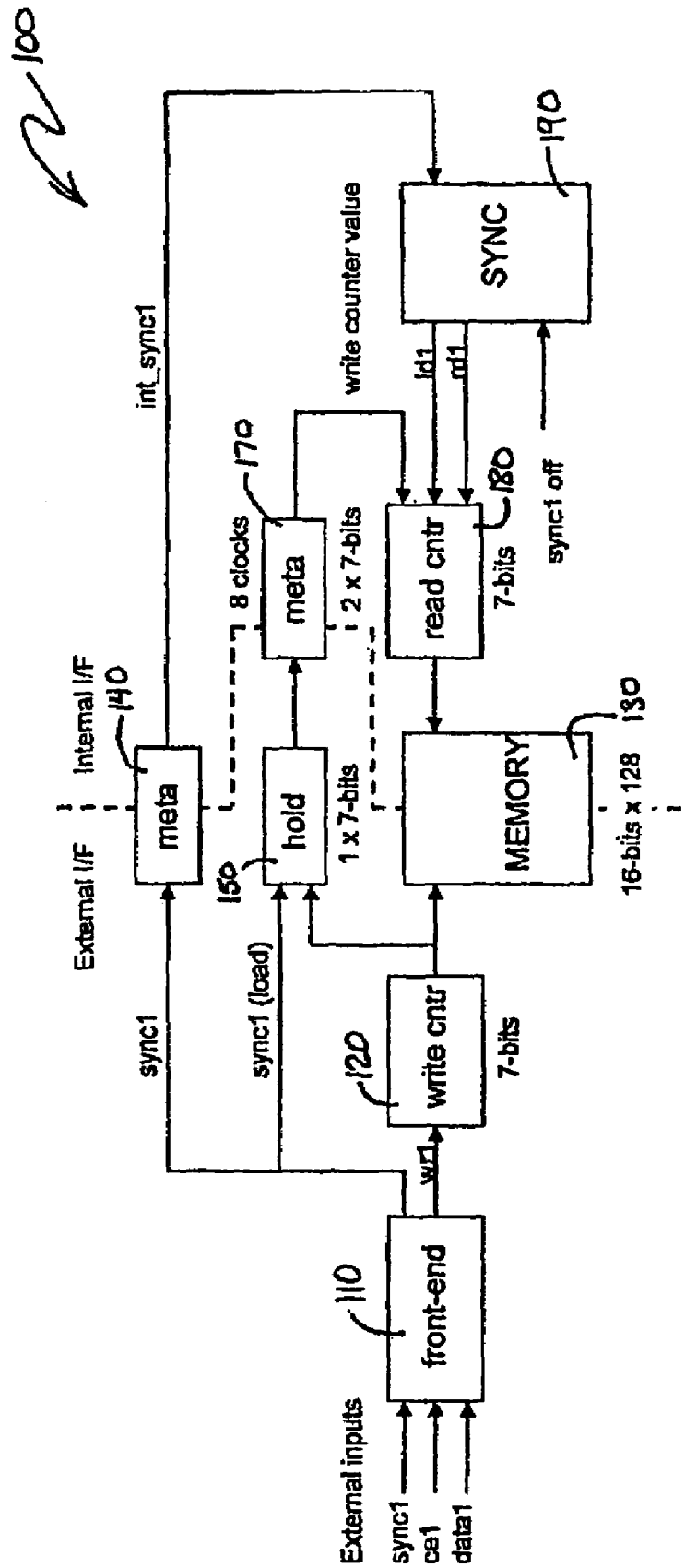
FIG. 1A is a schematic for an auto-recovery fault tolerant memory synchronization circuit according to one exemplary embodiment of the present invention.

FIG. 1A illustrates a schematic for an auto-recovery fault tolerant memory synchronization circuit 100 according to an exemplary embodiment of the present invention. Front-end device 110 receives external inputs sync1, ce1 and data1. The sync1 external input signal, when enabled, determines the start sequence of the data received (on the data1 external input). When data is continuously received by front-end device 110, the ce1 external input signal remains enabled. However, if the data received by front-end device 110 from the data1 external input is "bursty," ce1 signal is enabled while external data is being received, and is accordingly inactive if no data is being received.

External data is received by memory synchronization circuit 100 at front-end device 110 via the data1 external input. When the sync1 signal input is enabled, front-end device 110 can receive a predetermined number of data words from external input data1. During a write operation, write counter register 120 receives an enabled wr1 signal from front-end device 110, and begins writing data words received from the data1 input signal to memory array 130 at a memory location specified by the value stored in write counter register 120.

In the exemplary embodiment illustrated in FIG. 1A, write counter register 120 stores a 7-bit value, which is used to address a memory location to write a data word to in memory array 130. Memory array 230 is preferably a First-In First-Out (FIFO) memory array, but memory array 230 may be any other suitable memory device. Again, in the exemplary embodiment of FIG. 1A, memory array 130 is a 16-bit×128 memory device. However, memory array 130 may be a 16-bit×256 memory device, or any other suitable size. If a different memory array device size is selected, other components of memory synchronization circuit 100 can suitably be selected or modified to appropriately address the size of the memory array selected. For example, if the memory array is a 16-bit×256 device, other components of memory synchronization circuit 100 such as write counter register 120, hold register 150, meta register 170, and read counter register 180 may require 8-bits instead of 7-bits for proper addressability of a larger memory device.

Meta register 140, which receives the external input sync1 signal from front-end device 110, maintains consistency between the external interface clock domain and the internal interface clock domain. For high clock rate systems, utilizing one clock rate for all domains and synchronizing all devices within a circuit can be particularly difficult. Accordingly, in various embodiment of the present invention, the external clock domains are synchronized with the internal clock domains of memory synchronization circuit 100 using meta register 140 to minimize metastability problems. Meta register 140 receives external interface clock signal sync1, and outputs a stabilized internal interface clock signal int_sync1, which is directed to synchronization device 190 (or an optional stretch register, as described below).

Hold register 150 receives a sync (load) signal from front-end device 110 during a write operation. When the sync (load) signal is enabled, hold register 150 receives the write counter value from write counter register 120. Thus, hold register 150 stores the write counter value that represents a value for a memory location in memory array 130 where at least one data word has been written to during the write cycle.

Figure 2A:
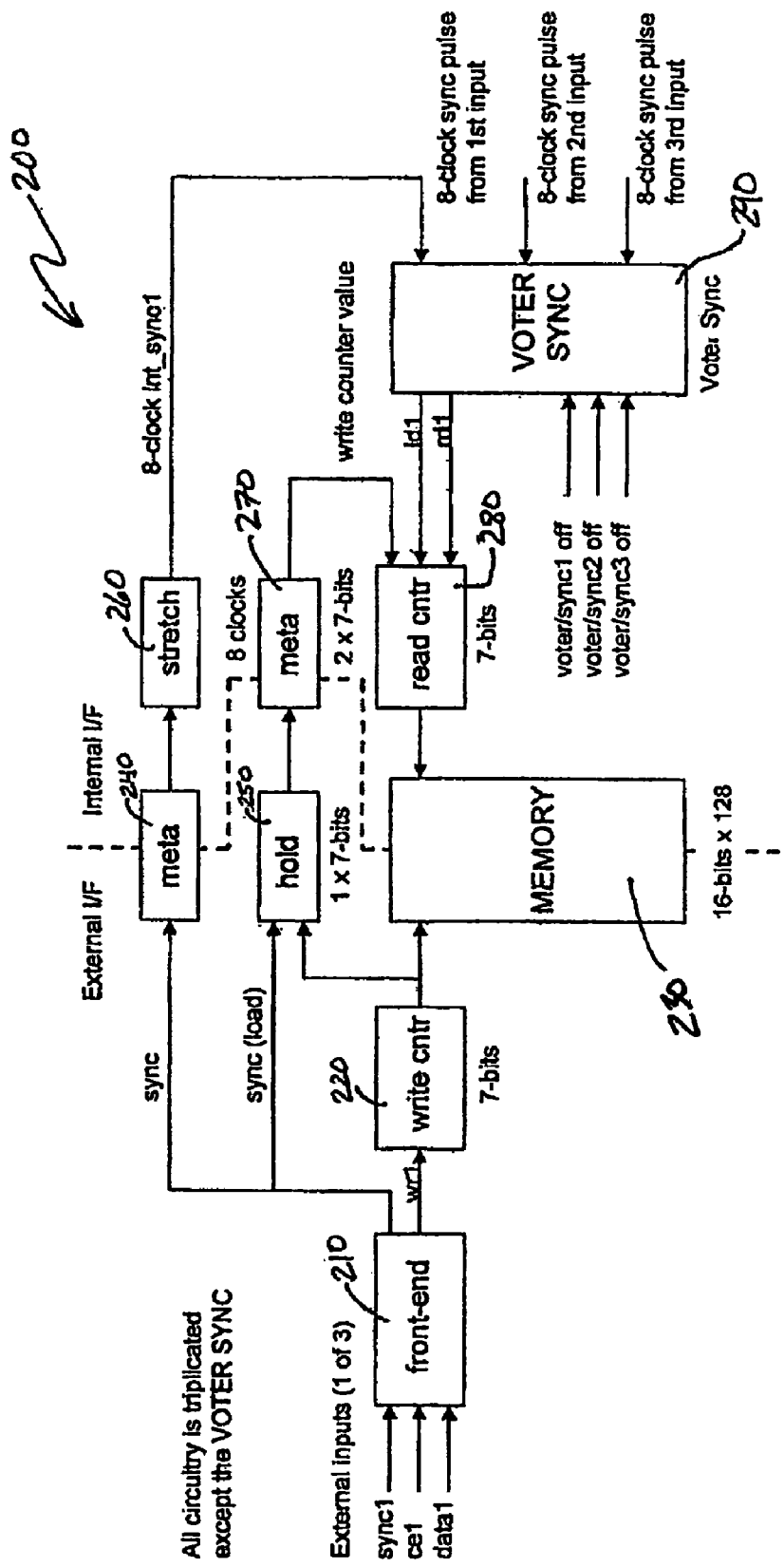
FIG. 2A is a schematic for an auto-recovery fault tolerant memory synchronization circuit with three separate data streams that are aligned for the purpose of fault tolerant majority voting according to one exemplary embodiment of the present invention.

Although it is not illustrated in the exemplary embodiment of FIG. 1A, memory synchronization circuit 100 may have a stretch register to receive a sync signal from meta register 140. The stretch register would receive a 1-clock cycle sync signal that was processed by meta register 140 and "stretch" it to an 8-clock cycle signal. Note that this stretch register would be an optional component in memory synchronization circuit 100, as there is only a single data input line (e.g., data1) and single front-end device (e.g., front-end device 110). For example, as illustrated in FIG. 2A, three data streams need to be addressed for fault tolerant majority voting. Accordingly, a stretch register can be used to increase a 1-cycle clock to a multi-cycle clock in order to create sufficient delay to receive data signals from multiple external input lines.

Similar to meta register 140, meta register 170 maintains consistency between the external interface clock domain and the internal interface clock domain. In the exemplary embodiment illustrated in FIG. 1A, meta register 170 is a 2×7-bit device, meaning that there are two 7-bit registers. Again, if memory array 130 was a different size, additional bits may be required for this register to properly handle addressability of memory array 130. The two 7-bit registers of meta register 170 are used to minimize metastability problems with the sync (load) signal received from front-end device 110 (that is passed to hold register 150) and the write counter value of hold register 150. For the read cycle, when the ld1 ("load") signal output from synchronization device 190 is enabled, read counter register 180 can receive the write counter value that was stored in meta register 170.

As illustrated in the exemplary embodiment of FIG. 1A, synchronization device 190 receives a 1-clock cycle int_sync1 signal from meta register 140 (or from an option stretch register, not shown). For the write cycle, synchronization device 190, upon receipt of a int_sync1 signal, sends a load signal (ld1) to read counter register 180, which proceeds to load the write counter value stored in meta register 170 into read counter register 180. Synchronization device 190 then enables the read signal output (rd1), which is received read counter register 180. Read counter register 180 uses the write counter value that it has received to read the data at the memory location of memory array 130. Thus, the last valid write counter address is used to initialize the read counter, regardless of overflow, underflow, or any other error condition.

Figure 1B:
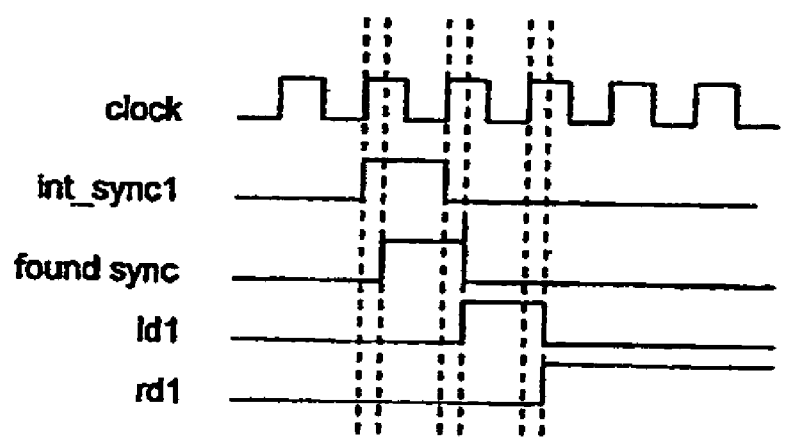
FIG. 1B is an exemplary timing diagram for the auto-recovery fault tolerant memory synchronization circuit of FIG. 1A.

The synchronization of the external and internal clock domains, and the loading of the write counter value into the read counter register, and reading data from the memory array is further illustrated in the timing diagram of FIG. 1B. Receipt of the leading edge of external sync1 signal by front-end device 110 results in the processing of the sync1 signal to minimize metastability problems between the clock domain of the external inputs and the clock domain of the internal inputs of memory synchronization circuit 100. After processing the sync1 signal, meta register 140 outputs an int_sync signal. A found sync signal is generated by synchronization device 190 in response to the leading edge of the int_sync signal (after a propagation or other related time delay between the leading edge of the int_sync1 signal and the found sync leading edge). In response to the falling edge of the found sync signal, synchronization device 190 generates a ld1 (load) signal. Based on the generation of the ld1 signal, the valid write counter value stored in meta register 170 is loaded into read counter register 180. The falling edge of the ld1 signal triggers synchronization device 190 to generate the rd1 signal, which is received by read counter register 180. Upon receipt of the rd1 signal, read counter register 180 uses the loaded write counter address to accordingly read the data stored in memory array 130 at the counter location.

FIG. 2A depicts a schematic for an auto-recovery fault tolerant memory synchronization circuit 200 with three separate data streams that are aligned for the purpose of fault tolerant majority voting according to one exemplary embodiment of the present invention. For simplicity, only one set of memory circuitry (e.g, front-end device 210, write counter register 220, memory array 230, meta register 240, hold register 250, stretch register 260, meta register 270 read counter register 280, and voter sync 290) is illustrated. In a three input system, there would be three corresponding sets of circuitry. However, only one voter synchronization device (e.g., voter synchronization device 290) would be needed, as it would output a single data set (e.g., after voting, after a fault recovery event, etc.) from the three received data lines. Again, for the purposes of simplicity, the exemplary embodiment of FIG. 2A described below is for one set of data circuitry, but the second and third set of data circuitry would operate in a similar fashion.

In FIG. 2A, front-end device 210 has external inputs sync1, ce1, and data1. These external inputs are similar to the sync1, ce1, and data1 lines described above in connection with front-end device 110 of the exemplary embodiment illustrated in FIG. 1A. Although only one front-end device is illustrated in FIG. 2A for simplicity, a three data stream memory synchronization circuit could have three separate front ends for the data lines. Thus, the second and third front-end devices (not shown) could similarly have sync, ce1, and data input signals as front-end device 210 does. In addition, front-end devices (e.g., front-end device 210) are optional components for memory synchronization circuit 200, as voter synchronization device 290 can be used to recover data when stability or other errors arise. The three input device depicted in FIG. 2A is merely an illustrative embodiment, as additional inputs could suitably be added to the auto-recovery fault tolerant memory synchronization circuit.

External data is received by memory synchronization circuit 200 at front-end device 210 via the data1 input. Upon receipt of the sync1 signal, front end 210 clocks in a predetermined number of data words. During a write operation, write counter register 220 receives an enabled wr1 signal from front-end device 210, and begins writing data words received from the data1 input signal (of front end 210) to memory array 230 at the location specified by write counter register 220.

In the exemplary embodiment illustrated in FIG. 2A, write counter register 220 stores a 7-bit value, which is used to address a memory location to write a data word to in memory array 230. Preferably, memory array 230 is a FIFO memory array, but memory array 230 could be any suitable memory device. Similarly to the exemplary embodiment illustrated in FIG. 1A, memory array 230 is a 16-bit×128 memory device. However, memory array 230 may be 16-bit×256, or any other suitable size. If a different memory array device size is selected, other components of memory synchronization circuit 200 can suitably be selected or modified to appropriately address the size of the memory array selected. For example, if the memory device is a 16-bit×256 memory device, other components of memory synchronization circuit 200 such as write counter register 220, hold register 250, meta register 270, and read counter register 280 may require 8-bits instead of 7-bits for proper addressability.

Meta register 240 receives the external input sync signal from front-end device 210 and maintains consistency between the external interface clock domain and the internal interface clock domain. Accordingly, the external clock domains are synchronized with the internal clock domains of memory synchronization circuit 200 to prevent metastability problems. Meta register 240 outputs a stabilized internal interface clock signal, which is directed to stretch register 260 for further processing as described below.

Hold register 250 receives a sync (load) signal from the front-end device 210 during a write operation. When the sync (load) signal is enabled, hold register 250 receives the write counter value from write counter register 220. Accordingly, hold register 250 stores the write counter value that represents a value for a memory location in memory array 230 where at least one data word has been written to during the write cycle.

Stretch register 260 permits the stretching of a 1-clock cycle sync signal to a multi-clock cycle sync signal. In an exemplary embodiment of the invention, stretch register 260 receives the 1-clock cycle sync signal processed by meta register 240 and stretches it to an 8-clock cycle signal. As the data being received by the three data inputs for the embodiment illustrated in FIG. 2A may not arrive at the same time, stretching the 1-clock cycle sync signal to a multi-clock cycle sync signal allows for adequate time to receive data from the three inputs. Furthermore, the three data streams need to be addressed for fault tolerant majority voting. Accordingly, it is preferable to utilize a stretch register to increase a 1-cycle clock to a multi-cycle clock in order to create sufficient delay to receive data signals from multiple external input lines. While the 1-clock cycle can be stretched to any suitable multi-clock cycle length, the maximum multi-clock cycle stretch length may be determined by the size of a memory array (e.g., memory array 230). For example, memory array 230 illustrated in FIG. 2A has a size of 16-bits×128. Accordingly, it is preferable that stretch register 260 not stretch the 1-clock cycle to greater than a 128-clock cycle length. If the multi-clock cycle exceeds the size of the memory device, the write cycle may over-write the data to be read during the read cycle.

Similar to meta register 240, meta register 270 maintains consistency between the external interface clock domain and the internal interface clock domain. In the exemplary embodiment illustrated in FIG. 2A, meta register 270 is a 2×7-bit device, meaning that there are two 7-bit registers. Again, if memory array 230 was a different size, additional bits may be required for this register to properly handle addressability of memory array 230. The two 7-bit registers of meta register 270 are used to minimize metastability problems with the sync (load) signal received from front-end device 210 (that is passed to hold register 250, which is a 1×7 bit device) and the write counter value of hold register 250. For the read cycle, when the ld1 ("load") signal output from voter synchronization device 290 is enabled, read counter register 280 can receive the write counter value that was stored in meta register 270.

For the read cycle, upon detection of the first sync signal (e.g., int_sync1), voter synchronization device 290 waits 8-clock cycles. If another sync signal (e.g., int_sync2) is detected by voter synchronization device 290 for a second set of data, the load signal (e.g., ld1) is enabled. Alternatively, if no other sync signals are received by voter synchronization device in the exemplary 8-clock cycle period, the first received sync signal is ignored and voter synchronization device 290 begins searching for a new sync signal.

If two or three sync signals are received (e.g., int_sync1 and int_sync2, etc.) and the ld1 signal is enabled, the write counter value stored in meta register 270 is loaded into read counter register 280. Next, voter sync circuit 290 enables the rd1 signal, which, when received by read counter register 280, allows a predetermined number of data words to be read from memory array 230 at location specified by the write counter value that was loaded into read counter register 280. Although three data lines are illustrated in the exemplary embodiment of FIG. 2A, voter synchronization device 290 typically uses two sync signals. A third sync signal is generally used if the first two data sets do not compare. Again, if no other sync signals are received by voter synchronization device 290 in 8-clock cycles after the reception of the first sync signal, voter synchronization device 290 can reset and wait to receive a first sync signal. If the sync signal is not found, voter synchronization device 290 may not enable the load signal (ld1), but can enable the read (rd1) signal to permit the reading of a predetermined number of data words from memory array 230 for fault tolerance purposes.

As illustrated in the exemplary embodiment illustrated in FIG. 2A, voter synchronization device 290 has voter/sync1, voter/sync2, and voter/sync3 inputs. If all of the voter/sync inputs are off, voter synchronization device 290 does not enable the read (e.g., rd1) signal. If two voter/sync inputs are off, but one voter/sync signal is enabled, a read signal can be enabled when another sync signal is found. Voter synchronization device 290 uses majority voting to determine when the majority of a group of signaling channels (e.g., the three data inputs) is properly conveying a common message in conjunction with a status signal individual to each channel (e.g., voter/sync1, voter/sync2, voter/sync3). Accordingly, voter synchronization device 290 utilizes majority voting to determine which data stream that has been stored in a memory array is to be read out and utilized.

Figure 2B:
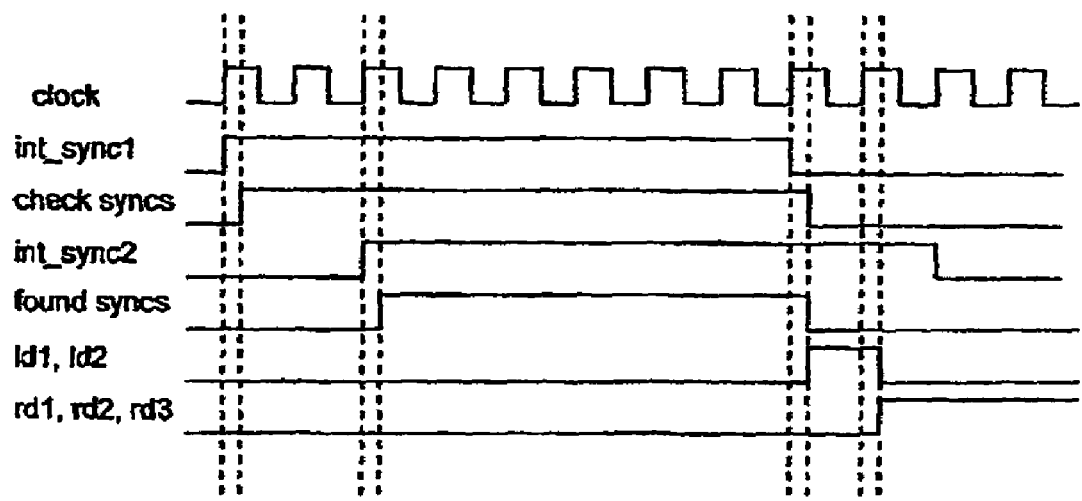
FIG. 2B is an exemplary timing diagram for the auto-recovery fault tolerant memory synchronization circuit with three separate data streams of FIG. 2A.

The operation of the read cycle with multiple data lines and a voter synchronization device is illustrated in the timing diagram of FIG. 2B. The 8-clock int_sync1 signal is formed by stretch register 260, which takes a stabilized 1-clock cycle sync signal from meta register 240 and preferably stretches it to an 8-clock cycle sync signal. The leading edge of the 8-clock int_sync1 signal triggers voter synchronization device 290 to perform a check for additional sync signals (e.g., check syncs signal is enabled). In the exemplary timing diagram, a second stabilized 8-clock int_sync2 signal is enabled 2-clock cycles after the leading edge of the 8-clock int_sync1 signal. The leading edge of the 8-clock int_sync2 signal triggers a found syncs signal. At the falling edge of the 8-clock int_sync1 signal, which occurs 8-clocks after the signal was enabled, the check syncs signal goes inactive, as does the found syncs signal become inactive. The falling edge of the 8-clock int_sync1 signal triggers the 8-clock int_sync2 signal becoming inactive 2-clock cycles later (in this exemplary timing diagram, the 8-clock sync2 signal was enabled 2-clock cycles after the 8-clock int_sync1 signal). The falling edge of the found syncs signal triggers the ld1 or ld2 ("load") signals to become enabled. Thus, the read counter registers are loaded with the stabilized write counter values from the meta registers. The falling edge of the ld1 and ld2 signals activates the rd1, rd2, or rd3 ("read") signals. Accordingly, a predetermined number of data words are read from the respective memory array devices at the address specified in the read counter registers.

The detailed description set forth below in connection with the appended drawings is intended as a description of various embodiments of the invention and is not intended to represent the only embodiments in which the invention may be practiced. The detailed description includes specific details for the purpose of providing a thorough understanding of the invention. However, it will be apparent to those skilled in the art that the invention may be practiced without these specific details. In some instances, well known structures and components are shown in block diagram form in order to avoid obscuring the concepts of the invention.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The various illustrative logical blocks, modules, circuits, elements, and/or components described in connection with the embodiments disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing components, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

The previous description is provided to enable any person skilled in the art to practice the various embodiments described herein. Various modifications to these embodiments will be readily apparent to those skilled in the art, and the generic principles defined herein may be applied to other embodiments. Thus, the claims are not intended to be limited to the embodiments shown herein, but is to be accorded the full scope consistent with the language claims, wherein reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An integrated circuit memory control device with a memory array having a read access port and a write access port, comprising:
 a write counter register that is coupled to an external data input and to the write access port of the memory array, wherein the write counter register is configured to receive data from the external data input, generate a write address value, and store the received data in the memory array at the write address value; and
 a read counter register configured to receive the write address value, wherein the read counter register reads the stored data from the memory array at the write address value.

2. The integrated circuit memory control device of claim 1, further comprising a front-end device that is configured to receive at least one external synchronization signal and at least one data signal, wherein the front-end device is coupled to the write counter register.

3. The integrated memory control device of claim 2, further comprising:
 a first register, wherein the first register is configured to synchronize the external clock synchronization signal with an internal clock synchronization signal;
 a synchronization device configured to receive the internal clock synchronization signal from the first register, wherein the synchronization device, upon receipt of the internal clock synchronization signal, instructs the read counter register to load the write address value and read stored data from the memory array at the write address value.

4. The integrated circuit memory control device of claim 3, wherein the synchronization device is a majority voter synchronization device configured to select for output the data received from the at least one external input and written to the memory array.

5. The integrated circuit memory device of claim 3, further comprising a second register configured to stretch the internal clock synchronization signal over multiple clock cycles.

6. The integrated memory control device of claim 1, further comprising:
 a hold register coupled to the write counter register, wherein the hold register is configured for storing the write address value of the write counter; and
 a third register coupled to the hold register, wherein the third register is configured to receive the write address value and synchronize an external clock synchronization signal with an internal clock synchronization signal.

7. The integrated memory control device of claim 1, wherein the memory array is a First-In First-Out (FIFO) memory array.

8. A method of operating an integrated circuit memory control device that can support read and write access for at least one external input to a memory array therein, the method comprising the steps of:
 (a) receiving an external clock synchronization signal;
 (b) writing new data received from the at least one external input to the memory array at an address value stored by a write counter register;
 (c) storing the address value of the write counter register in a hold register;
 (d) synchronizing an external clock synchronization signal with an internal clock synchronization signal to minimize metastability problems;
 (e) generating a load signal with a synchronization device upon receipt of an internal clock synchronization signal by the synchronization device;
 (f) loading a read counter register with the address value stored in the hold register; and
 (g) generating a read signal with the synchronization device and reading data from the memory array at the address value that was loaded into the read counter register.

9. The method of claim 8, further comprising stretching the internal clock synchronization signal from a 1-clock cycle internal synchronization signal to a multiple clock cycle internal synchronization signal after step (d).

10. The method of claim 8, wherein a front-end device receives the external clock synchronization signal at step (a) and receives the new data received from the at least one external input that is written to memory array at step (b).

11. The method of claim 8, further comprising generating a read signal with the synchronization device and reading data from the memory array at the address value loaded into the read counter register for fault tolerance purposes if the internal synchronization signal is not received by the synchronization device at step (e).

12. The method of claim 8, wherein the synchronization device is a majority voter synchronization device configured to select for output the new data received from the at least one external input and written to the memory array.

13. The method of claim 8, wherein the writing new data received from the at least one external input is to a First-In First-Out (FIFO) memory array.

14. An integrated circuit memory control device, comprising:
 (a) a memory array having a read access port and a write access port;
 (b) a write counter register that is coupled to an external data input and to the write access port of the memory array, wherein the write counter register is configured to receive data from the external data input, generate a write address value, and store the received data in the memory array at the write address value;
 (c) a first register coupled to a synchronization device, wherein the first register is configured to synchronize an external clock synchronization signal with an internal clock synchronization signal;
 (d) a hold register coupled to the write counter register, wherein the hold register is configured for storing the write address value of the write counter;
 (e) a second register coupled to the hold register, wherein the second register is configured to receive the write address value and synchronize an external clock synchronization signal with an internal clock synchronization signal;
 (f) a read counter register configured to receive the write address value from the hold register;

(g) a synchronization device coupled to the read counter register and configured to receive an internal clock synchronization signal, wherein the synchronization device, upon receipt of the internal clock synchronization signal, instructs the read counter register to load the write address value and read stored data from the memory array at the write address value.

15. The integrated circuit memory control device of claim 14, further comprising a front-end device that is configured to receive at least one external synchronization signal and at least one data signal, wherein the front-end device is coupled to the write counter register.

16. The integrated memory control device of claim 14, wherein the memory array is a First-In First-Out (FIFO) memory array.

\* \* \* \* \*